United States Patent

Yuan

(10) Patent No.: US 9,547,742 B2
(45) Date of Patent: Jan. 17, 2017

(54) SYSTEMS AND METHODS FOR VIA PLACEMENT

(71) Applicant: FREESCALE SEMICONDUCTOR, INC., Austin, TX (US)

(72) Inventor: Chi-Min Yuan, Austin, TX (US)

(73) Assignee: NXP USA, Inc., Austin, TX (US)

(*) Notice: Subject to any disclaimer, the term of this patent is extended or adjusted under 35 U.S.C. 154(b) by 65 days.

(21) Appl. No.: 14/696,575

(22) Filed: Apr. 27, 2015

(65) Prior Publication Data

US 2016/0314238 A1    Oct. 27, 2016

(51) Int. Cl.
*G06F 9/455* (2006.01)
*G06F 17/50* (2006.01)

(52) U.S. Cl.
CPC ....... *G06F 17/5081* (2013.01); *G06F 17/5072* (2013.01)

(58) Field of Classification Search
USPC ................................................ 716/112, 132
See application file for complete search history.

(56) References Cited

U.S. PATENT DOCUMENTS

| | | | |
|---|---|---|---|
| 6,760,901 B2 | 7/2004 | Bergman Reuter et al. | |
| 7,738,632 B2 | 6/2010 | Popescu | |
| 2015/0379188 A1* | 12/2015 | Kahng | G06F 17/5081 716/53 |

OTHER PUBLICATIONS

Chan, et al., "Post-routing back-end-of-line layout optimization for improved time-dependent dielectric breakdown reliability," Proc. SPIE 8684, Design for Manufacturability through Design-Process Integration VII, 86840L (Mar. 29, 2013); doi:10.1117/12.2011645.

* cited by examiner

*Primary Examiner* — Brian Ngo

(57) ABSTRACT

A method for configuring a via in a semiconductor device includes determining time dependent dielectric breakdown failure rate as a function of distance between the via and a metal line, generating candidate via configurations with different sizes, rotation, and offset values for the via, determining TDDB failure rate for the candidate via configurations, and selecting one of the candidate via configurations with an optimal TDDB failure rate for the via.

19 Claims, 7 Drawing Sheets

SYSTEMS AND METHODS FOR VIA PLACEMENT

BACKGROUND

Field

This disclosure relates generally to semiconductor devices, and more specifically, to placing vias to minimize time dependent dielectric breakdown.

Related Art

Backend Time Dependent Dielectric Breakdown (TDDB), also referred to as electrical shorts, can develop over time between a via (Vx) and an adjacent upper and lower metal layers (Mx+1 and Mx). TDDB can become a major reliability problem in advanced technology nodes where devices, and the spacing between them, are ever decreasing in size.

Referring to FIG. 13, a side cross-sectional view of an example of a via 1302 between a first metal line 1304 and a second metal line 1306 that are part of a first connection net (net 1) is shown. A third metal line 1310 is shown in the same metal layer as metal line 1306, however metal line 1310 is part of a second connection net (net 2). FIG. 14 shows a partial top view of the via 1302 and metal lines 1304, 1306, 1310 of FIG. 13. TDDB problems arise because the exterior sidewall 1308 of via 1302 has a tapered profile where the top portion of via 1302 at metal line 13 1304 has a larger cross-sectional diameter than the bottom portion of via 1302 at metal line 1306. The dielectric material between the top edge of via 1302 and neighboring metal line 1310 (denoted as $d_{top}$) may break down over time, causing a short between the first and second connection nets. To avoid reliability issues due to TDDB, common practices are to set a maximum (relatively small) number of vias that can be placed adjacent metal lines, or use a larger spacing rule for routing metal layers which requires more space. Accordingly, further improvements to minimize space required while still providing the desired number and location of via contacts in a given area, are sought.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed that minimize backend Time Dependent Dielectric Breakdown (TDDB) failure by optimizing via design in the routing and mask preparation stages, without increasing the die size. Semiconductor fabrication may typically only allow vias of one size for high printability and minimal routing track usage. Embodiments of the present disclosure allow vias of similar designs, which are of similar area and thus similar printability. For example, a typical limit for vias at 28 nm technology is 50 nm×130 nm in size, while sizes of 55×125 and 60×110 would have the same printability. The advantage of having a few flexible sizes, rotations and offsets as disclosed herein is to increase via to metal line spacing and minimize TDDB failure rate based on specific geometry in that local routing area.

During routing, for each via site in the layout, test patterns for the via are selected from a previously defined list of test patterns that are within the desired performance of TDDB failure rate. The total TDDB failure rate is calculated based on failure rates for the spacing values of the via to lower metal lines and the via to upper metal lines. The via test patterns can include vias of different orientation, different offsets and different sizes. The via that yields the lowest TDDB failure rate, or meets other selection criteria, is then selected for each via. There is no area increase since no metal lines are moved during this process.

During an Optical Proximity Correction (OPC) retargeting step in mask preparation, size adjustment for vias can be further performed, based on the same failure rate data to minimize TDDB failure rate. The advantage of performing in OPC retargeting step is that finer adjustment of via sizes can be chosen because there is no restriction on using the manufacturing grid.

Figure 1:
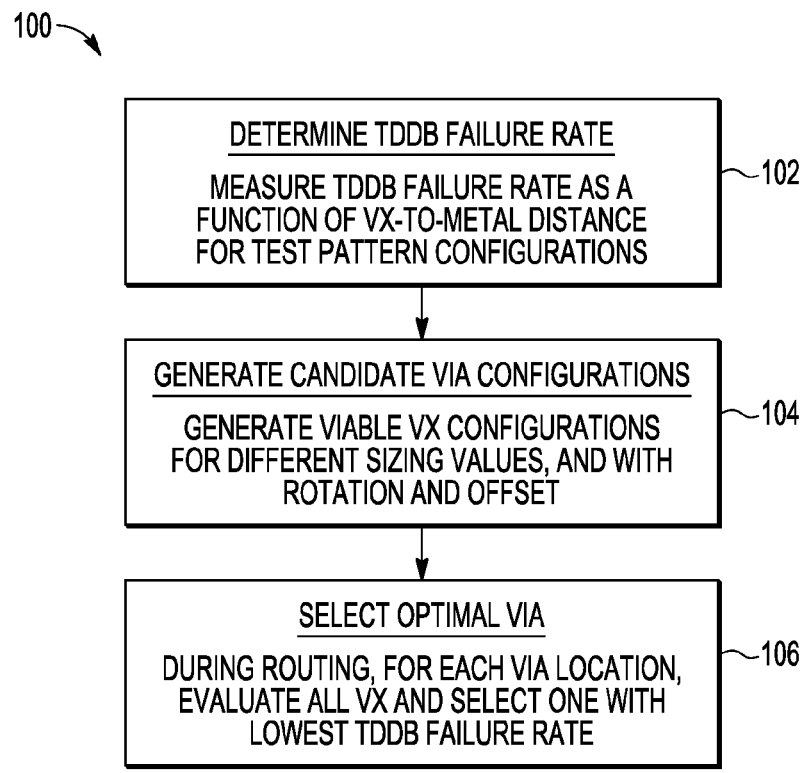
FIG. 1 is a flow diagram of an embodiment of a method for generating and selecting vias to minimize Time Dependent Dielectric Breakdown (TDDB) in accordance with the invention.

FIG. 1 is a flow diagram of an embodiment of a method 100 for generating and selecting vias to minimize TDDB in accordance with the invention. Process 102 includes determining TDDB failure rate by measuring TDDB failure rate as a function of via to metal line spacing for a variety of via to upper and lower metal line test patterns. For rectangular vias, which are the majority of vias used in advanced technology nodes such as 28 nanometer, test patterns can include spacing from both the long side and short side of the vias, since the behaviors may be different.

The test patterns and corresponding failure rate data are then stored for use during subsequent routing design stages. For example, the test patterns can be stored in a library exchange format (LEF) file that can be accessed using an electronic design automation (EDA) system.

Figure 2:
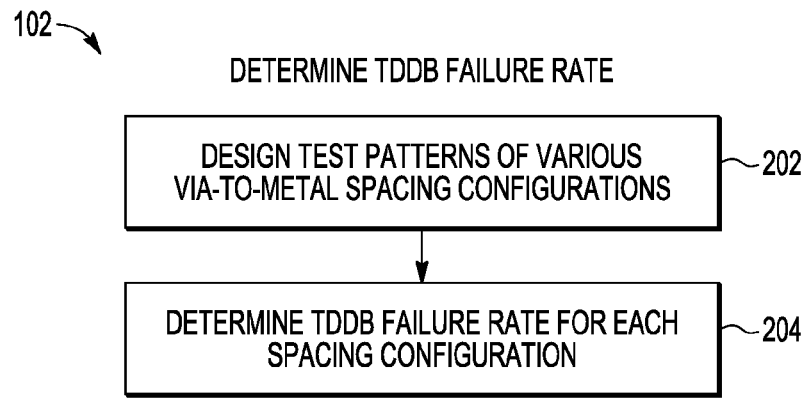
FIG. 2 is a flow diagram of an embodiment of a method for quantifying TDDB failure rate that can be used in the method for generating and selecting vias to minimize TDDB of FIG. 1.
Figure 3:
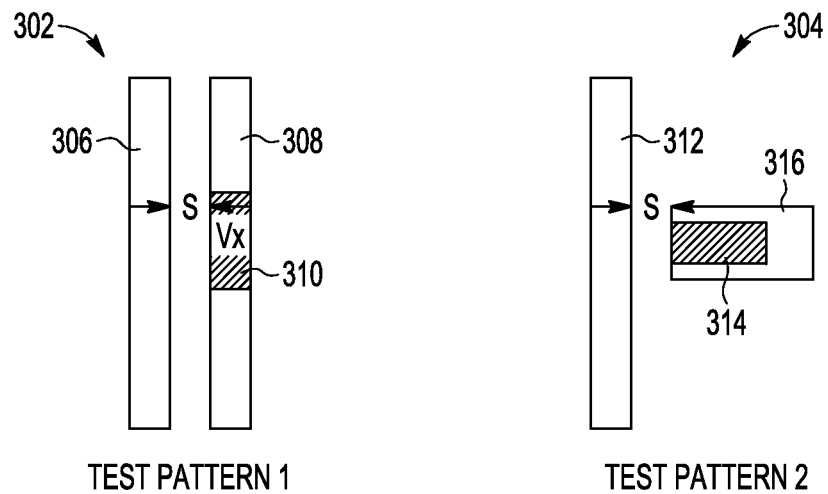
FIG. 3 illustrates embodiments of two different test patterns that may be used in the method for generating and selecting vias to minimize TDDB of FIG. 1.

FIG. 2 is a flow diagram of an embodiment of process 102 for determining TDDB failure rate that can be used in the method 100 for generating and selecting vias to minimize TDDB of FIG. 1. Process 202 includes defining test patterns of various via to upper metal spacing configurations and via to lower metal spacing configurations. FIG. 3 illustrates embodiments of two different test patterns 302, 304 that may be used in process 202. In test pattern 302, metal lines 306, 308 are placed a fixed distance S apart and run parallel to one another lengthwise. Rectangular via (or via bar) 310 is coupled to and also runs parallel to metal line 308 lengthwise. Variations of test pattern 302 can include moving metal lines 306, 308 further apart and/or closer together, and using different dimensions for via 310 that have approximately equivalent top-down or drawn area. For example, vias with drawn dimensions of 50×130, 55×125 and 60×110 have approximately equivalent drawn areas, and thus have approximately equivalent manufacturing latitude. Other suitable dimensions can be used, however.

For other test patterns, via 310 and the metal line 308 coupled to via 310 can be rotated approximately 90 degrees with respect to metal line 306. For example test pattern 304 shows metal line 312 perpendicular to metal line 316. Via 314 is a rectangular bar that is coupled along the length of metal line 316. Metal line is wider than metal line 312. Variations of test pattern 304 can include moving metal lines 312, 316 further apart and/or closer together, different dimensions (width and length) of metal line 316, and using different dimensions for via 314 that have equivalent drawn area. In other embodiments, via 314 may have a different drawn area than via 314 as shown.

Metal lines 306, 308, 312, 316 can be upper or lower metal lines. Note that a first set of test patterns 302, 304 can be generated with upper metal lines, and a second set of test patterns 302, 304 can be generated with lower metal lines.

Figure 4:
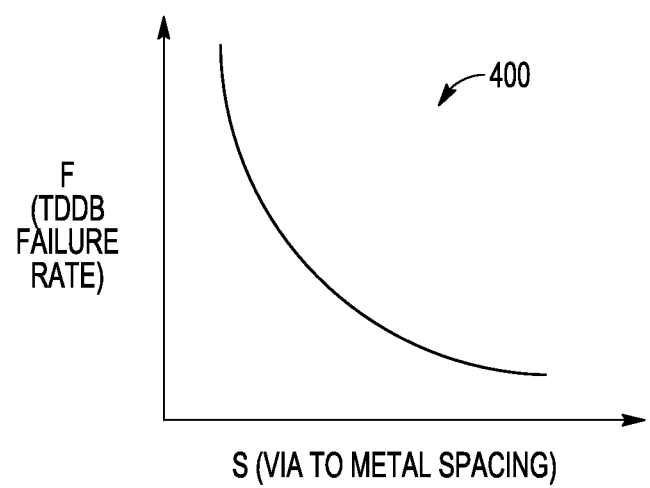
FIG. 4 illustrates a graph of TDDB failure rate versus via to metal spacing that may be generated to determine vias that minimize TDDB in the method of FIG. 1.

FIG. 4 illustrates a graph 400 of TDDB failure rate versus via to metal spacing (S) that may be generated to determine vias that minimize TDDB in the method 100 of FIG. 1. The failure rate decreases as space between vias and metal layers increases. Graph 400 shows an exponential decay profile with the highest failure rate at the closest spacing and the lowest failure rate at the highest spacing. To determine failure rate for a via, empirical data for design test patterns can be collected and made available for use in method 202.

Figure 5:
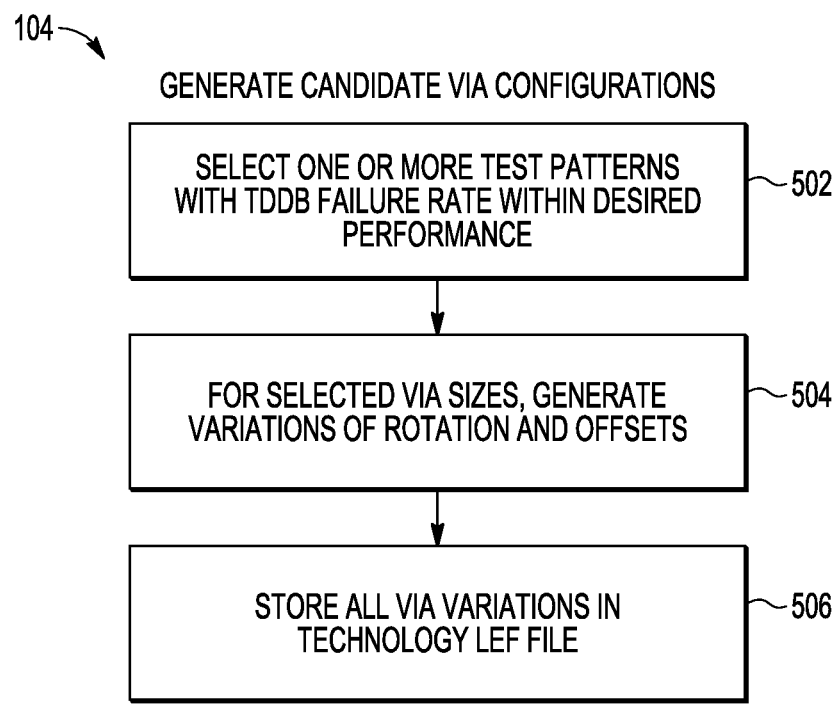
FIG. 5 is a flow diagram of an embodiment of a method for quantifying TDDB failure rate that can be used in the method for generating and selecting vias to minimize TDDB of FIG. 1.

Referring to FIGS. 1 and 5, process 104 includes generating candidate via configurations. FIG. 5 is a flow diagram of an embodiment of process 104. Process 502 includes selecting one or more of the via test patterns generated in process 102 (FIG. 1) that have a TDDB failure rate within desired performance parameters. This can include taking into account the shape or size of the via and the spacing between the via and the nearest upper and/or lower metal line.

Figure 7:
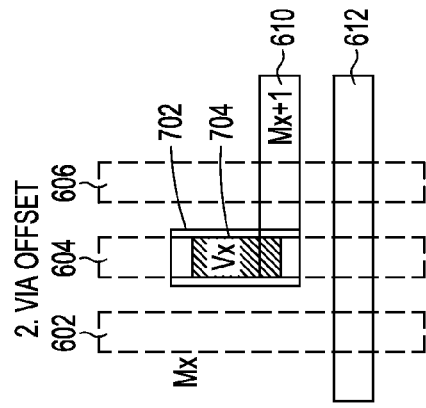
FIGS. 6-8 illustrate top views of embodiments of different test patterns for via rotation, offset, and sizing that may be used in the method for generating and selecting vias to minimize TDDB of FIG. 1.
Figure 6:
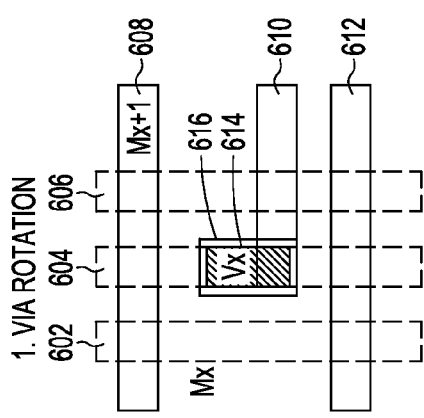
Figure 8:
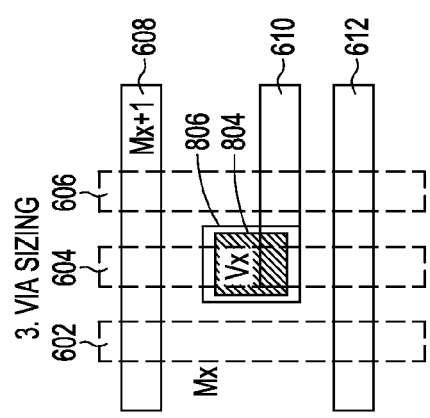

Process 504 includes generating variations of the selected test patterns by changing the dimensions, rotating, and/or offsetting the via. As examples, FIGS. 6-8 illustrate top layout views of embodiments of different test patterns for via rotation, offset, and sizing that may be used in process 504 of FIG. 5. Lower metal lines 602-606 are shown in dashed lines while upper metal lines 608-612 are shown in solid lines.

FIG. 6 shows an embodiment of via 614 rotated ninety degrees with respect to upper metal lines 608-612. Via 614 is coupled to lower metal line 604, upper metal line 610, and upper metal line 616. Metal line 610 is parallel to metal lines 608 and 612 and metal line 616 is parallel to lower metal lines 602-606 and perpendicular to upper metal lines 608-612. Via 614 is shaped as a bar or rectangle, with length greater than width from the top view. The nominal width of via 614 is approximately the same as the width of lower metal line 604 and slightly less than the width of upper metal line 616. The length of metal line 616 is approximately the same as the length of via 614. One end of metal line 616 overlaps one end of metal line 610 and one end of via 614. Metal line 610 overlaps and terminates over via 614

FIG. 7 shows an embodiment of via 704 rotated ninety degrees and offset with respect to upper metal lines 610-612. Via 704 has the same dimensions as via 614 and is coupled to lower metal line 604, upper metal line 610, and upper metal line 702. Metal line 610 is parallel to metal line 612 and has one end that overlaps and terminates over via 704. Metal line 702 is parallel to lower metal lines 602-606 and perpendicular to upper metal lines 608-612. Via 704 is shaped as a bar or rectangle, with length greater than width from the top view. The nominal width of via 704 is approximately the same as the width of lower metal line 604 and slightly less than the width of upper metal line 616. The length of metal line 702 is greater than the length of via 704. One end of metal line 702 overlaps one end of metal line 610. The length of via 704 can be positioned anywhere along the length of metal line 702 provided at least a portion of an end of via 704 is in contact with a portion of an end of metal line 610. As shown, via 704 is offset from metal line 612 by approximately half the width of metal line 610. In the resulting combination, a portion of the end of via 704 is positioned between lower metal lie 604 and a portion of upper metal line 610, thus increasing the space between the end of via 704 and nearest metal line 612.

FIG. 8 shows an embodiment of via 804 having approximately the same square area as vias 614 and 704 with different width and length dimensions. In the example shown, via 804 has an increased width and reduced length compared to vias 614 and 704 in respective FIGS. 6 and 7. Via 804 is coupled to lower metal line 604, upper metal line 610, and upper metal line 806. Metal line 610 is parallel to metal line 612 and has one end that extends and terminates over via 804. Metal line 806 is parallel to lower metal lines 602-606 and perpendicular to upper metal lines 608-612. Via 804 is shaped as a bar or rectangle, with length greater than width from the top view. The nominal width of via 804 is greater than the width of lower metal line 604 and slightly less than the width of upper metal line 806. The length of metal line 806 is slightly greater than the length of via 804. One end of metal line 806 overlaps one end of metal line 610. The length of via 804 is slightly offset from an end of metal line 610 but is still in contact with a portion of an end of metal line 610. In the resulting configuration, the spacing between the ends of via 804 and metal lines 608 and 612 is greater than the spacing between the ends of via 614 and metal lines 608 and 612 in FIG. 6.

Figure 9:
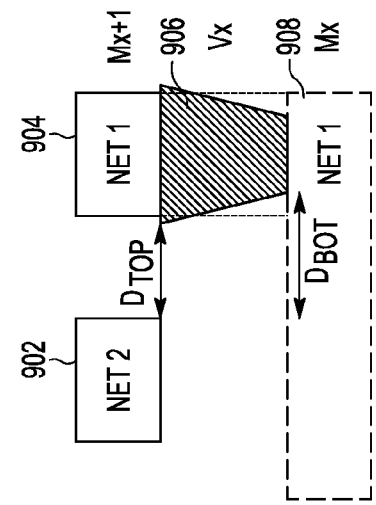
FIG. 9 illustrates a side cross-sectional view of an embodiment of a via showing additional parameters that can be varied to minimize TDDB.

FIG. 9 illustrates a side cross-sectional view of an embodiment of via 906 showing additional parameters that can be varied to minimize TDDB in accordance with process 504 of FIG. 5. Upper metal lines 902, 904 run parallel to one another, and lower metal line 908 runs perpendicular to metal lines 902, 904. Via 906 is coupled between metal lines 904 and 908. The side cross-section of via 906 may be varied by changing the top and bottom dimensions of via 906. The top dimension of via 906 can be changed opposite a change in the bottom dimension of via 906 to keep the same manufacturing latitude while changing the spacing between the nearest metal line 902. For example, to increase the spacing between the top of via 906 and adjacent upper metal line 902, the top dimension of via 906 may be decreased while the bottom dimension of via is increased. Alternatively, to decrease the spacing between the top of via 906 and adjacent upper metal line 902, the top dimension of via 906 may be increased while the bottom dimension of via 906 is increased. The drawn area and its manufacturing latitude of via 906 thus remains the same while varying the shape to minimize TDDB.

Figure 10:
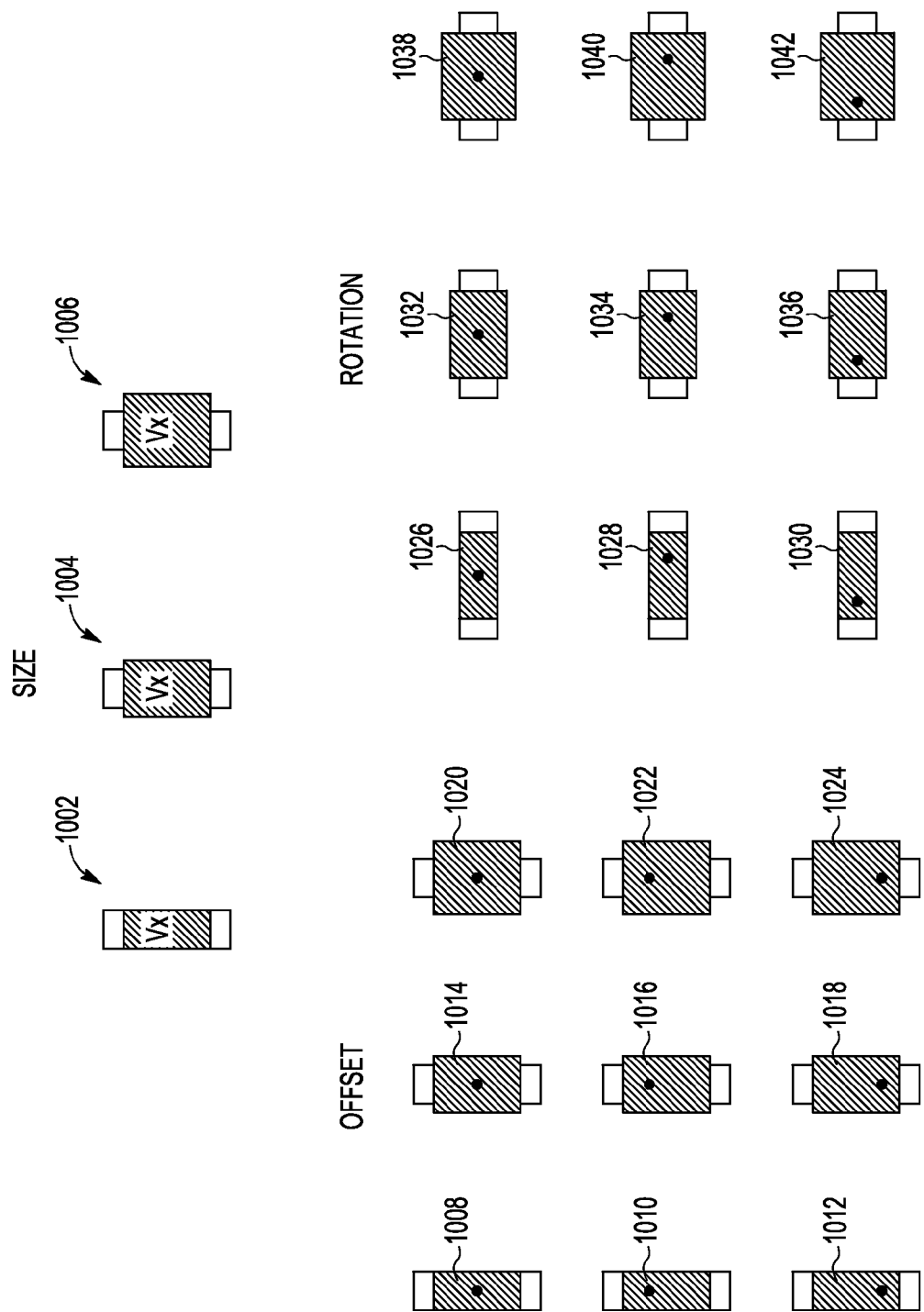
FIG. 10 illustrates top views of embodiments of different test patterns for via rotation, offset, and sizing that may be used to minimize TDDB.

FIG. 10 illustrates top views of embodiments of different test patterns 1002-1042 for via rotation, offset, and sizing that may be generated in process 504 of FIG. 5. The vias are shown as solid rectangles and the metal lines are shown as an outline overlying respective vias. Test patterns 1002-1006 are rectangles with length being longer than their width, and the length is centered along the length of corresponding metal lines. The position of a dot on each of the vias indicates an offset. For example, a dot in the center of a via indicates no offset. A dot at an upper or lower end of the via indicates an offset in one direction or the other.

Test patterns 1002, 1004, 1006 show three different sizes of vias, with the via of test pattern 1002 having a width that is the same as the metal line. Test pattern 1004 has a width that is greater than the metal line and a length that is shorter than the via of test pattern 1002. Test pattern 1006 has a width that is greater than the width of the vias in test patterns 1002 and 1004 and a length that is less than the length of vias in test patterns 1002 and 1004. Example sizes for test patterns 1002, 1004, 1006 can be 50×130, 55×125, or 60×110 as mentioned before. Other suitable drawn sizes can be used, however.

Test patterns 1008-1024 show various offset configurations of test patterns 1002-1006. In particular, test pattern 1008 is based on test pattern 1002 with no offset and so is similar to test pattern 1002. Test patterns 1010 and 1012 are also based on test pattern 1002 with test pattern 1010 having an offset at one end of the via and test pattern 1012 having an offset at an opposite end of the via compared to test pattern 1010.

Test pattern 1014 is based on test pattern 1004 with no offset and so is similar to test pattern 1004. Test patterns 1016 and 1018 are also based on test pattern 1004 with test pattern 1016 having an offset at one end of the via and test pattern 1018 having an offset at an opposite end of the via compared to test pattern 1016.

Test pattern 1020 is based on test pattern 1006 with no offset and so is similar to test pattern 1006. Test patterns 1022 and 1024 are also based on test pattern 1006 with test pattern 1022 having an offset at one end of the via and test pattern 1024 having an offset at an opposite end of the via compared to test pattern 1022.

Test patterns 1026-1042 show various rotation configurations of test patterns 1002-1006. In particular, test pattern 1026 is based on test pattern 1002 with a 90 degree rotation and no offset. Test patterns 1028 and 1030 are also based on test pattern 1002 with a 90 degree rotation. Test pattern 1028 further has an offset at one end of the via and test pattern 1030 has an offset at an opposite end of the via compared to test pattern 1028.

Test pattern 1032 is based on test pattern 1004 with a 90 degree rotation with no offset. Test patterns 1034 and 1036 are also based on test pattern 1002 with a 90 degree rotation. Test pattern 1034 further has an offset at one end of the via and test pattern 1036 has an offset at an opposite end of the via compared to test pattern 1034.

Test pattern 1038 is based on test pattern 1006 with a 90 degree rotation with no offset. Test patterns 1040 and 1042 are also based on test pattern 1002 with a 90 degree rotation. Test pattern 1040 further has an offset at one end of the via and test pattern 1042 has an offset at an opposite end of the via compared to test pattern 1040.

Test patterns 1002-1042 can be stored in a file, such as a library exchange format (LEF) file, that is accessible by an electronic design automation (EDA) system or other suitable system. Once several test patterns are available, process 106 of FIG. 1 includes, for each via in the design, evaluating all candidate vias from the test patterns and selecting an optimal configuration for each corresponding via. Selection of the optimal vias may occur as metal lines are being routed during the design process. In some cases, the candidate via with the lowest TDDB failure rate can be selected as the optimal via, however other criteria can be used to select an optimal via.

Figure 11:
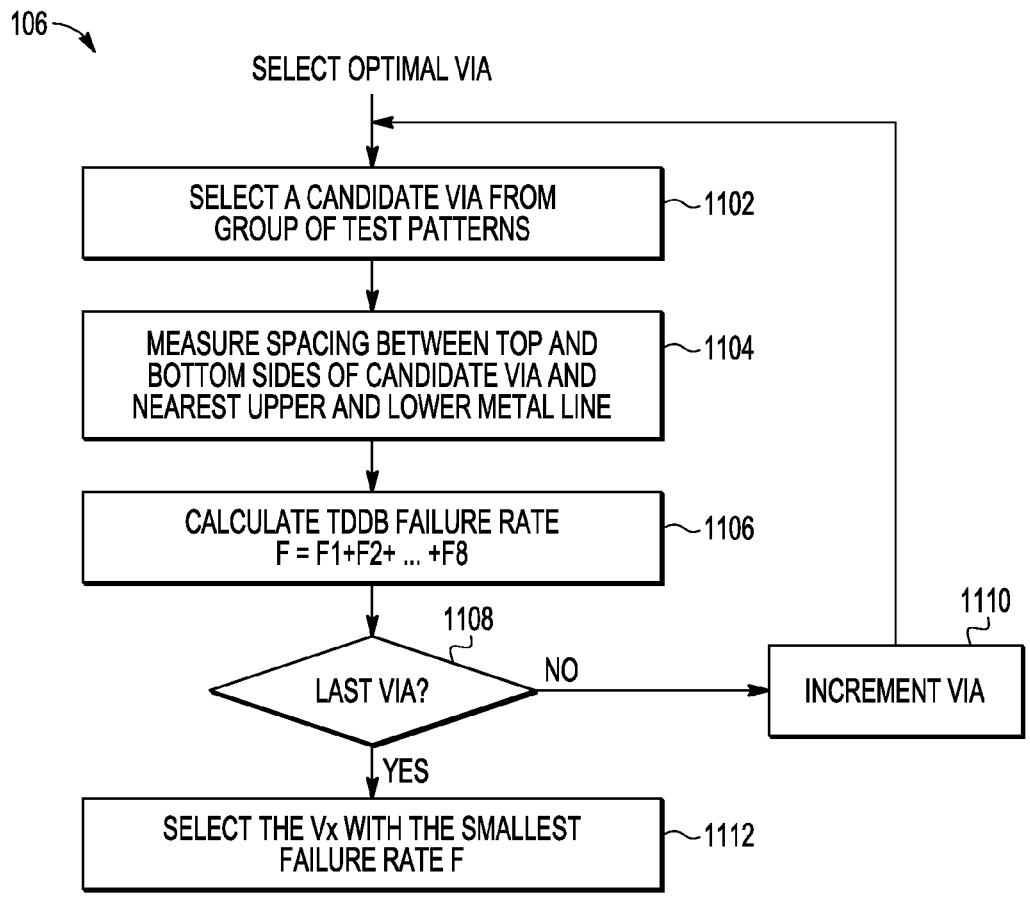
FIG. 11 is a flow diagram of an embodiment of a method for selecting an optimal via that can be used in the method for generating and selecting vias to minimize TDDB of FIG. 1.

FIG. 11 is a flow diagram of an embodiment of process 106 (FIG. 1) for selecting an optimal via. Process 1102 includes selecting one of the candidate vias from the group of test patterns. Process 1104 includes measuring the spacing between each of the top and bottom sides of the candidate via and the upper and lower metal lines in closest proximity to each side that are not coupled to the via.

Figure 12:
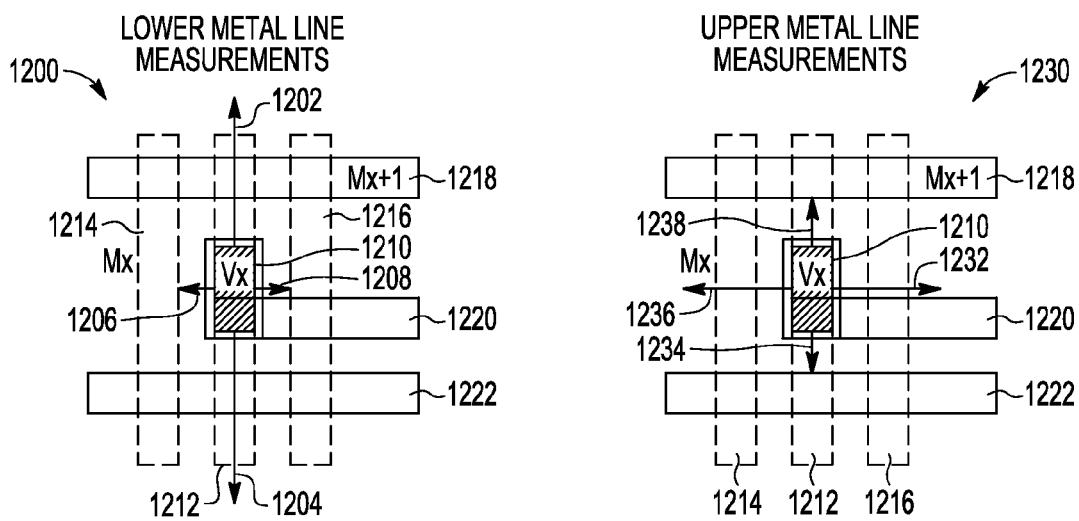
FIG. 12 illustrates top views of embodiments of measurements that may be used in the method for generating and selecting vias to minimize TDDB of FIG. 1.
Figure 13:
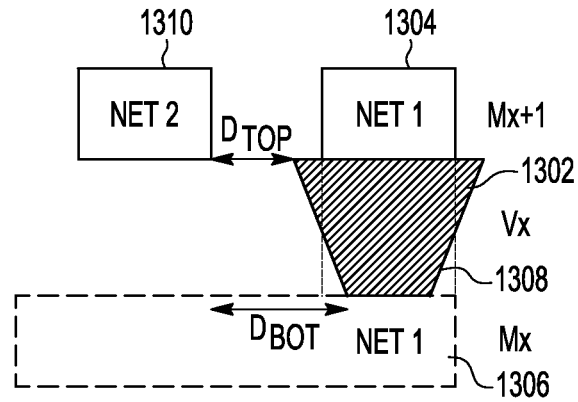
FIG. 13 illustrates a side cross-sectional view of an embodiment of a via and upper and lower metal lines.
Figure 14:
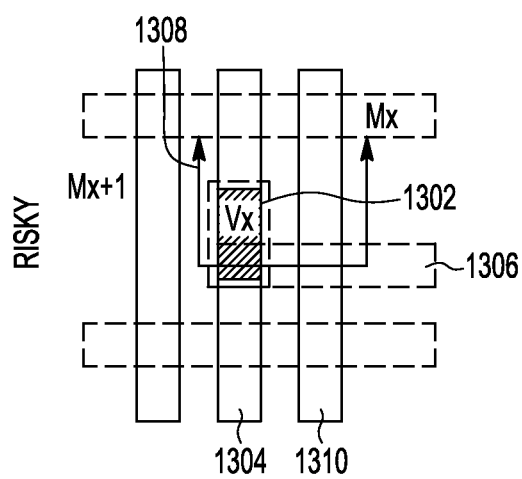
FIG. 14 illustrate a partial top view of the via with upper and lower metal lines of FIG. 13.

FIG. 12 illustrates top views of examples of measurements that may be used in process 1104. Layout 1200 shows a top view of measurement arrows 1202-1208 for measuring spacing between sides of via 1210 and lower metal lines 1214, 1216. Although a top view of via 1210 is shown, via 1210 is three dimensional and has top and bottom sides, such as shown in FIG. 9.

Via 1210 is coupled between lower metal line 1212 and upper metal line 1220. Arrow 1206 indicates space between a first bottom side along the length of rectangular via 1210 and lower metal line 1214 in closest proximity to the first bottom side of via 1210. Arrow 1208 indicates space between a second bottom side along the length of rectangular via 1210 and lower metal line 1216 in closest proximity to the second bottom side of via 1210. Arrow 1202 indicates space between a third bottom side along the width of rectangular via 1210 and a lower metal line (not shown) in closest proximity to the third bottom side. Arrow 1204 indicates space between a fourth bottom side along the width of rectangular via 1210 and a lower metal line (not shown) in closest proximity to the fourth bottom side of via 1210.

Arrow 1236 indicates space between a first top side along the length of rectangular via 1210 and upper metal line 1214 in closest proximity to the first top side of via 1210. Arrow 1232 indicates space between a second top side along the length of rectangular via 1210 and upper metal line 1216 in closest proximity to the second top side of via 1210. Arrow 1238 indicates space between a third top side along the width of rectangular via 1210 and an upper metal line (not shown) in closest proximity to the third top side. Arrow 1234 indicates space between a fourth top side along the width of rectangular via 1210 and an upper metal line (not shown) in closest proximity to the fourth top side of via 1210.

Once the spacing between the top and bottom sides of via 1210 and metal lines in closest proximity to each side are measured, process 1106 in FIG. 11 includes calculating an incremental TDDB failure rate for each measurement, and then adding up the incremental failure rates to get a total failure rate for the via/metal line routing configuration. In the example shown, there are eight incremental failure rates, F1 though F8, corresponding to four top and bottom sides of the via. The intermediate failure rates and the total failure rate for the via may be stored for later processing to find an optimal via configuration.

Process 1108 includes determining whether the selected candidate via is the last via among the candidates of test patterns. If the selected candidate via is not the last via, process 1110 increments the candidate via and returns to process 1106 to determine spacing measurements and incremental and total failure rates for the next candidate via. If the selected candidate via is the last via, process 1112 includes selecting the optimal candidate via, which in some cases, may be the candidate via with the smallest total failure rate. Other criteria for selecting the optimal via, such as a candidate via with a total failure rate within a specified range and spacing at specified maximums, or other suitable criteria, may be used.

By now it should be appreciated that in some embodiments, there has been provided a method for configuring a via in a semiconductor device that can comprise determining time dependent dielectric breakdown (TDDB) failure rate as a function of distance between the via and a metal line (102, 202), generating candidate via configurations with different sizes, rotation, and offset values for the via (104), determining TDDB failure rate for the candidate via configurations, and selecting one of the candidate via configurations with an optimal TDDB failure rate for the via (106).

In another aspect, determining TDDB failure rate can comprise generating test patterns for various via sizes and shapes to metal line spacing configurations according to electronic design system rules (202); and determining a TDDB failure rate for each of the test patterns (204).

In another aspect, generating candidate via configurations can comprise selecting the test patterns with a TTDB failure rate within desired performance (502), and generating variations of rotation and offset values for the selected test patterns (504).

In another aspect, generating candidate via configurations can comprise, for at least one of the candidate via configurations, decreasing a top portion of the via; and increasing a bottom portion of the via.

In another aspect, generating candidate via configurations can comprise, for at least one of the candidate via configurations, changing at least one of the length and the width of the via.

In another aspect, generating candidate via configurations can comprise, for at least one of the candidate via configurations, rotating the via approximately ninety degrees.

In another aspect, generating candidate via configurations can comprise, for at least one of the candidate via configurations, offsetting an initial position of the via along a metal line associated with the via.

In another aspect, determining TDDB failure rate for the candidate via configurations can comprise, for each of the candidate via configurations, determining a first set of distances between each side of a top portion of the candidate via configuration and a nearest upper metal line, determining a second set of distances between each side of a bottom portion of the candidate via configuration and a nearest lower metal line, determining intermediate TDDB failure rates for the candidate via configuration at each of the first and second sets of distances, and determining an overall TDDB failure rate for the candidate via configuration by summing the intermediate TDDB failure rates for the candidate via configuration.

In another aspect, selecting one of the candidate via configurations with the optimal TDDB failure rate can comprise selecting one of the candidate via configurations with a lowest TDDB failure rate for the via.

In other embodiments, a method for configuring a via in a semiconductor device can comprise determining time dependent dielectric breakdown (TDDB) failure rates for various configurations of spacing between the via and upper and lower metal lines (102, 202), generating candidate via configurations with different shape and position characteristics for the via (104), and determining TDDB failure rate for the candidate via configurations by adding intermediate failure rates of each of the candidate via configurations. The intermediate failure rates are based on spacing between upper and lower sides of the candidate via configuration and respective nearest upper and lower metal lines (1104, 1106). One of the candidate via configurations with an optimal TDDB failure rate for the via (106) is then selected.

In another aspect, determining TDDB failure rates can comprise generating test patterns for various via sizes and shapes to metal line spacing configurations according to electronic design system rules (202); and determining a TDDB failure rate for each of the test patterns (204).

In another aspect, generating candidate via configurations can comprise, selecting the test patterns with a TTDB failure rate within desired performance (502), and generating variations of size, rotation and offset values for the selected test patterns (504).

In another aspect, generating candidate via configurations can comprise, for at least one of the candidate via configurations, decreasing a top portion of the via and increasing a bottom portion of the via.

In another aspect, generating candidate via configurations can comprise, for at least one of the candidate via configurations, changing at least one of the length and the width of the via.

In another aspect, generating candidate via configurations can comprise, for at least one of the candidate via configurations, rotating the via approximately ninety degrees.

In another aspect, generating candidate via configurations can comprise, for at least one of the candidate via configurations, offsetting an initial position of the via along a metal line associated with the via.

In another aspect, selecting one of the candidate via configurations with the optimal TDDB failure rate can comprise selecting one of the candidate via configurations with a lowest TDDB failure rate for the via.

In further embodiments, a method for configuring vias in a semiconductor device can comprise determining time dependent dielectric breakdown (TDDB) failure rates for various configurations of spacing between the vias and nearest metal lines (102, 202), generating candidate via configurations with different shape and position characteristics for the vias (104) including variations of size, rotation, and offset of an initial position of the vias along a metal line associated with the vias, determining TDDB failure rate for the candidate via configurations, and selecting one of the candidate via configurations with the lowest TDDB failure rate for the via (106).

In another aspect, generating candidate via configurations can comprise, selecting the candidate via configurations with a TTDB failure rate within desired performance (502), and storing the candidate via configurations in a location accessible by an electronic design system.

In another aspect, generating candidate via configurations can comprise, for at least one of the candidate via configurations, decreasing a top portion of the via, increasing a bottom portion of the via, and changing at least one of the length and the width of the via.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for configuring a via in a semiconductor device, comprising:
   determining time dependent dielectric breakdown (TDDB) failure rate as a function of distance between the via and a metal line;
   generating candidate via configurations with different sizes, rotation, and offset values for the via;
   determining TDDB failure rate for the candidate via configurations, comprising:
      for each of the candidate via configurations,
      determining a first set of distances between each side of a top portion of the candidate via configuration and a nearest upper metal line;
      determining a second set of distances between each side of a bottom portion of the candidate via configuration and a nearest lower metal line;
      determining intermediate TDDB failure rates for the candidate via configuration at each of the first and second sets of distances;
      determining an overall TDDB failure rate for the candidate via configuration by summing the intermediate TDDB failure rates for the candidate via configuration; and
   configuring the via according to one of the candidate via configurations with an optimal TDDB failure rate.

2. The method of claim 1 wherein the determining TDDB failure rate comprises:
   generating test patterns for various via sizes and shapes to metal line spacing configurations according to electronic design system rules; and
   determining a TDDB failure rate for each of the test patterns.

3. The method of claim 2 wherein the generating candidate via configurations comprises:
   selecting the test patterns with a TTDB failure rate within desired performance;
   generating variations of rotation and offset values for the selected test patterns.

4. The method of claim 1 wherein the generating candidate via configurations comprises:
   for at least one of the candidate via configurations:
      decreasing a top portion of the via; and
      increasing a bottom portion of the via.

5. The method of claim 1 wherein the generating candidate via configurations comprises:
   for at least one of the candidate via configurations:
      changing at least one of the length and the width of the via.

6. The method of claim 1 wherein the generating candidate via configurations comprises:
   for at least one of the candidate via configurations:
      rotating the via approximately ninety degrees.

7. The method of claim 1 wherein the generating candidate via configurations comprises:
   for at least one of the candidate via configurations:
      offsetting an initial position of the via along a metal line associated with the via.

8. The method of claim 1 wherein the selecting one of the candidate via configurations with the optimal TDDB failure rate comprises:
   selecting one of the candidate via configurations with a lowest TDDB failure rate for the via.

9. A method for configuring a via in a semiconductor device, comprising:
   determining time dependent dielectric breakdown (TDDB) failure rates for various configurations of spacing between the via and upper and lower metal lines;
   generating candidate via configurations with different shape and position characteristics for the via;
   determining TDDB failure rate for the candidate via configurations by adding intermediate failure rates of each of the candidate via configurations, wherein the intermediate failure rates are based on spacing between upper and lower sides of the candidate via configuration and respective nearest upper and lower metal lines; and
   configuring the via according to one of the candidate via configurations with an optimal TDDB failure rate.

10. The method of claim 9 wherein the determining TDDB failure rates comprises:
    generating test patterns for various via sizes and shapes to metal line spacing configurations according to electronic design system rules; and
    determining a TDDB failure rate for each of the test patterns.

11. The method of claim 10 wherein the generating candidate via configurations comprises:
    selecting the test patterns with a TTDB failure rate within desired performance;
    generating variations of size, rotation and offset values for the selected test patterns.

12. The method of claim 9 wherein the generating candidate via configurations comprises:
    for at least one of the candidate via configurations:
       decreasing a top portion of the via; and
       increasing a bottom portion of the via.

13. The method of claim 9 wherein the generating candidate via configurations comprises:
    for at least one of the candidate via configurations:
       changing at least one of the length and the width of the via.

14. The method of claim 9 wherein the generating candidate via configurations comprises:
for at least one of the candidate via configurations:
rotating the via approximately ninety degrees.

15. The method of claim 9 wherein the generating candidate via configurations comprises:
for at least one of the candidate via configurations:
offsetting an initial position of the via along a metal line associated with the via.

16. The method of claim 9 wherein the selecting one of the candidate via configurations with the optimal TDDB failure rate comprises:
selecting one of the candidate via configurations with a lowest TDDB failure rate for the via.

17. A method for configuring vias in a semiconductor device, comprising:
determining time dependent dielectric breakdown (TDDB) failure rates for various configurations of spacing between the vias and nearest metal lines;
generating candidate via configurations with different shape and position characteristics for the vias including variations of size, rotation, and offset of an initial position of the vias along a metal line associated with the vias;
determining TDDB failure rate for the candidate via configurations by adding intermediate failure rates of each of the candidate via configurations, wherein the intermediate failure rates are based on spacing between upper and lower sides of the candidate via configuration and respective nearest upper and lower metal lines; and
configuring the via according to one of the candidate via configurations with the lowest TDDB failure rate.

18. The method of claim 17 wherein the generating candidate via configurations comprises:
selecting the candidate via configurations with a TTDB failure rate within desired performance;
storing the candidate via configurations in a location accessible by an electronic design system.

19. The method of claim 17 wherein the generating candidate via configurations comprises:
for at least one of the candidate via configurations:
decreasing a top portion of the via;
increasing a bottom portion of the via;
changing at least one of the length and the width of the via.

* * * * *